(12) United States Patent
Bethoux et al.

(10) Patent No.: US 11,171,256 B2
(45) Date of Patent: *Nov. 9, 2021

(54) PROCESS FOR MANUFACTURING A PLURALITY OF CRYSTALLINE SEMICONDUCTOR ISLANDS HAVING A VARIETY OF LATTICE PARAMETERS

(71) Applicant: Soitec, Bernin (FR)

(72) Inventors: Jean-Marc Bethoux, La Buisse (FR); Morgane Logiou, Crolles (FR); Raphaël Caulmilone, Saint Pancrasse (FR)

(73) Assignee: Soitec, Bernin (FR)

( * ) Notice: Subject to any disclaimer, the term of this patent is extended or adjusted under 35 U.S.C. 154(b) by 315 days.

This patent is subject to a terminal disclaimer.

(21) Appl. No.: 16/352,029

(22) Filed: Mar. 13, 2019

(65) Prior Publication Data
US 2019/0288157 A1 Sep. 19, 2019

(30) Foreign Application Priority Data
Mar. 13, 2018 (FR) ........................ 1852155

(51) Int. Cl.
*H01L 33/00* (2010.01)
*H01L 33/06* (2010.01)
(Continued)

(52) U.S. Cl.
CPC ...... *H01L 33/0075* (2013.01); *H01L 21/0254* (2013.01); *H01L 21/02422* (2013.01);
(Continued)

(58) Field of Classification Search
CPC combination set(s) only.
See application file for complete search history.

(56) References Cited

U.S. PATENT DOCUMENTS 7,981,767 B2 7/2011 Guenard et al.
9,478,707 B2 10/2016 Guenard
(Continued)

FOREIGN PATENT DOCUMENTS

CN 101540357 A 9/2009
CN 102214759 A 10/2011
(Continued)

OTHER PUBLICATIONS

Hiroto et al., Emission color control from blue to red with nanocolumn diameter of InGaN/GaN nanocolumn arrays grown on same substrate, Applied Physics Letters, vol. 96, No. 23, (Jun. 7, 2010), pp. 231104-231104.
(Continued)

*Primary Examiner* — Mounir S Amer
(74) *Attorney, Agent, or Firm* — TraskBritt

(57) ABSTRACT

A method for manufacturing a plurality of crystalline semiconductor islands having a variety of lattice parameters includes the following steps: providing a relaxation substrate that comprises a medium, a flow layer disposed on the medium and, a plurality of strained crystalline semiconductor islands having an initial lattice parameter located on the flow layer, a first group of islands having a first lattice parameter and a second group of islands having a second lattice parameter that is different from the first; and heat treating the relaxation substrate at a relaxation temperature greater than or equal to the glass transition temperature of the flow layer to cause differentiated lateral expansion of the islands of the first and second group. The lattice parameter of the relaxed islands of the first group and the relaxed islands of the second group then have different values.

15 Claims, 4 Drawing Sheets

(51) Int. Cl.
  *H01L 27/15* (2006.01)
  *H01L 31/18* (2006.01)
  *H01L 33/32* (2010.01)
  *H01L 21/02* (2006.01)
  *H01L 25/075* (2006.01)
  *H01L 33/02* (2010.01)

(52) U.S. Cl.
  CPC .. *H01L 21/02458* (2013.01); *H01L 21/02639* (2013.01); *H01L 25/0753* (2013.01); *H01L 27/153* (2013.01); *H01L 31/1848* (2013.01); *H01L 31/1864* (2013.01); *H01L 33/06* (2013.01); *H01L 33/32* (2013.01); *H01L 33/0093* (2020.05); *H01L 33/025* (2013.01)

(56) References Cited

U.S. PATENT DOCUMENTS

| | | |
|---|---|---|
| 2002/0136932 A1 | 9/2002 | Yoshida |
| 2009/0045394 A1 | 2/2009 | Smeeton et al. |
| 2010/0087049 A1 | 4/2010 | Kononchuk |

FOREIGN PATENT DOCUMENTS

| | | |
|---|---|---|
| EP | 0786149 A1 | 7/1997 |
| EP | 2151852 A1 | 2/2010 |
| EP | 2151856 A1 | 2/2010 |
| EP | 2865021 A1 | 4/2015 |
| FR | 2936903 A1 | 4/2010 |

OTHER PUBLICATIONS

Shioda et al., Selective Area Metal-Organic Vapor Phase Epitaxy of Nitride Semiconductors for Multicolor Emission, Ieee Journal of Selected Topics in Quantum Electronics, vol. 15, No. 4, (Jul. 1, 2009), pp. 1053-1065.

Yin et al., Buckling Suppression of SiGe Islands on Compliant Substrates, Journal of Applied Physics, vol. 94, No. 10, (Nov. 15, 2003), pp. 6875-6882.

Liu et al., Monolithic LED Microdisplay on Active Matrix Substrate Using Flip-Chip Technology, IEEE Journal of Selected Topiz in Quantum Electronics, vol. 15, Issue 4, (Jul.-Aug. 2009), pp. 1-5.

Liu et al., 360 PPI Flip-Chip Mounted Active Matrix Addressable Light Emitting Diode on Silicon (LEDoS) Micro-Displays, Journal of Display Technology, vol. 9, No. 8, (Aug. 2013), pp. 678-682.

French Search Report for French Application No. 1852155 dated Nov. 23, 2018, 2 pages.

Durnev et al., Strain Effects on Indium Incorporation and Optical Transitions in Green-Light InGaN Heterostructures of Different Orientations, vol. 208, Issue 11, (Nov. 2011), pp. 2671-2675.

French Written Opinion from French Application No. 1852155, dated Nov. 23, 2018, 9 Pages with English translation.

PROCESS FOR MANUFACTURING A PLURALITY OF CRYSTALLINE SEMICONDUCTOR ISLANDS HAVING A VARIETY OF LATTICE PARAMETERS

PRIORITY CLAIM

This application claims the benefit of the filing date of French Patent Application Serial No. FR1852155, filed Mar. 13, 2018, for "A Process for Manufacturing a Plurality of Crystalline Semiconductor Islets Having a Variety of Lattice Parameters," the disclosure of which is incorporated herein in its entirety by this reference.

TECHNICAL FIELD

The present disclosure concerns a method for manufacturing a plurality of crystalline semiconductor islands having a variety of lattice parameters. This method makes it possible to prepare a growth substrate, notably for the formation of optoelectronic devices. This disclosure applies, for example, to the collective manufacturing of devices having optoelectronic properties that can be different from one another. In particular, this disclosure can be applied in the field of micro-display screens.

BACKGROUND

The documents EP2151852 and EP2151856 disclose a technology intended to form, on a substrate, islands of relaxed or partially relaxed crystalline semiconductor material. These islands can be used for the collective manufacture of light-emitting diodes (LEDs), as explained in detail in document EP2865021, for example.

Multiple products combine LEDs emitting at various wavelengths to form a colored light point. This is, among others, the case for display screens that enable an image consisting of pixels to be formed, each pixel combining a red, a green, and a blue LED, whose emission can be controlled individually to form a light point of the selected color, by combining light emissions.

The LEDs that are combined to form the pixel are generally not manufactured from the same materials and by using the same technologies. Thereby, blue or green LEDs may consist of nitride (with the general formula InGaN) and red LEDs of phosphide (with the general formula AlGaInP). Manufacturing a screen involves the assembly of the diodes, one by one, to form the pixels of the final device, e.g., using a pick-and-place technique.

Since the materials do not have the same properties, the characteristics pertaining to the ageing, thermal/electrical behavior, and/or efficiency of the devices that use them are generally very different. These variabilities must be taken into account when designing a product that includes LEDs consisting of different materials, which may sometimes render the design very complex.

Other solutions provide for forming the pixels from diodes that are all identical, manufactured on the same substrate and/or by using the same technology. Monolithic micro-LED panels having a reduced size and a high resolution can then be realized. By way of example of such an embodiment, one may refer to the document entitled "360 PPI Flip-Chip Mounted Active Matrix Addressable Light Emitting Diode on Silicon (LEDoS) Micro-Displays," Zhao Jun Liu et al., *Journal of Display Technology*, April 2013. The light radiation emitted by the micro-panel's LEDs can be chosen in the ultraviolet range and selectively converted, from one diode to another, to various wavelengths in order to correspond to red, green, and blue light emissions so as to form a color screen. This conversion can be achieved by placing a phosphorescent material on the emitting face of the LEDs. However, the conversion consumes light energy, which reduces the quantity of light emitted by each pixel and thus the efficiency of the display device. It also requires dispensing the phosphorescent materials on the emitting surfaces of the LEDs, which renders the manufacturing method of these micro-panels more complex. Moreover, the size of the particles of phosphorescent material may exceed the desired dimension of the bright pixels, which does not always allow for this solution to be used.

In order to overcome the limitations discussed above, it would be desirable to be able to simultaneously manufacture, on the same substrate, by using the same technology, LEDs capable of emitting in different wavelengths.

More generally, it would be advantageous to have a growth substrate allowing the collective manufacture of devices having optoelectronic properties that are different one from another.

BRIEF SUMMARY

In view of achieving one of these goals, the disclosure provides a method for manufacturing a plurality of crystalline semiconductor islands having a variety of lattice parameters. The method includes the following steps:

- providing a relaxation substrate comprising a medium, a flow layer arranged on the medium and, arranged on the flow layer, a plurality of crystalline semiconductor islands having the same initial lattice parameter, a first group of islands having a first level of strain and a second group of islands having a second level of strain that is different from the first;
- heat-treating the relaxation substrate at a relaxation temperature greater than or equal to the glass transition temperature of the flow layer to cause differentiated lateral expansion of the islands of the first and second group.

Consequently, the lattice parameter of the relaxed islands of the first group and the relaxed islands of the second group then have different values. The differentiated properties of these islands can be used to collectively manufacture devices with different properties, such as optoelectronics.

According to other advantageous and non-limiting characteristics of the disclosure, taken either separately or in any technically feasible combination:

- the step in which the relaxation substrate is provided includes the following:
  - the formation on a base substrate of a stack of elementary crystalline semiconductor layers having a first area and a second area that have different strain levels;
  - the transfer of at least part of the stack to the medium;
  - the execution of trenches on the stack to form the islands of the first group of islands in the first area and to form the islands of the second group of islands in the second area;
- the execution of trenches in the stack is performed after the transfer to the medium;
- the formation of the stack on the base substrate includes the following:
  - the formation of a plurality of pseudomorphic elementary layers having different compositions;
  - the localized removal of part of the elementary layers to define the first area and the second area;

the method comprises forming a planarization layer on the stack to allow its assembly to the support substrate;

the relaxation temperature is between 400° C. and 900° C.;

the crystalline semiconductor islands are made of III-N material;

the method includes a step during which relaxed islands of the first group and relaxed islands of the second group are transferred to a growth medium;

the transfer step includes carrying over the relaxed islands of the first group and the relaxed islands of the second group to an intermediary medium.

BRIEF DESCRIPTION OF THE DRAWINGS

Further characteristics and advantages of the disclosure will appear from the detailed description of the disclosure, made in reference to the accompanying figures, among which.

DETAILED DESCRIPTION

Growth Substrate

Figure 1A:
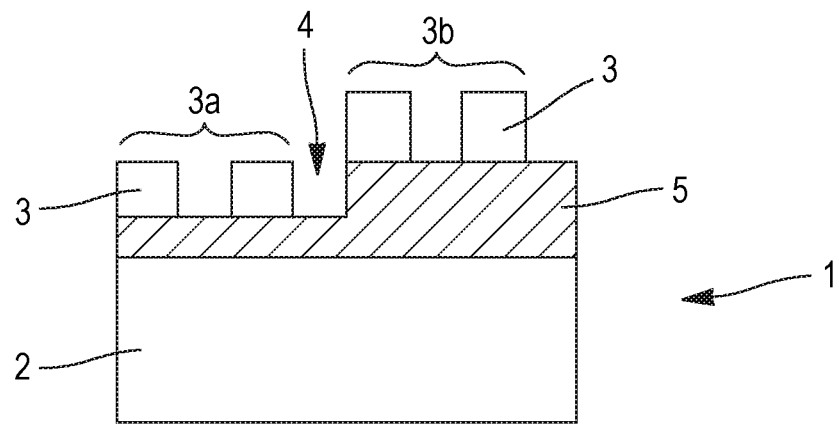
FIGS. 1A and 1B schematically show a cross-section and a top view of a growth substrate according to the disclosure.
Figure 1B:
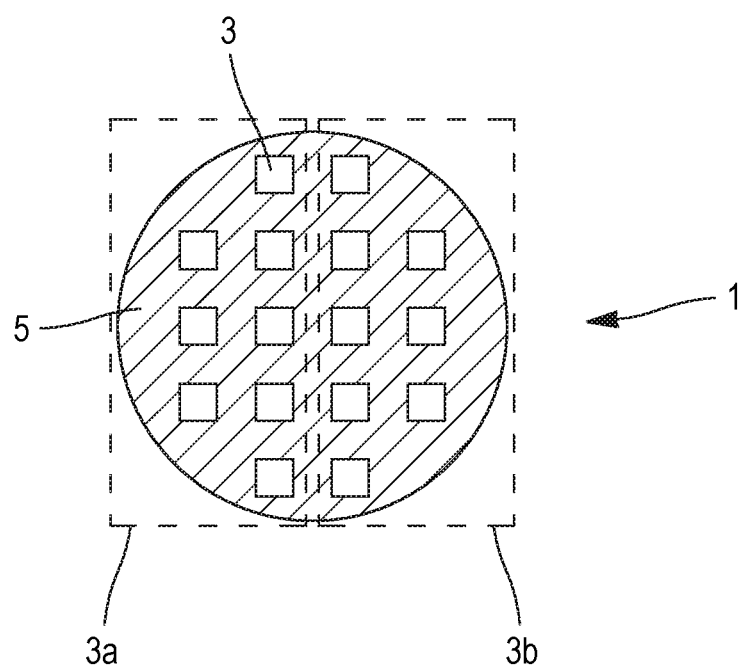

According to a first aspect, the present disclosure relates to a growth substrate 1 for forming optoelectronic devices. FIGS. 1A and 1B schematically show a cross-section and a top view of such a substrate. The growth substrate 1 is intended to be placed in deposition equipment, such as an epitaxy frame, in order to form active layers of optoelectronic components on the exposed surface of the growth substrate 1. The growth substrate 1 can also serve as mechanical support allowing for devices to be manipulated during further manufacturing steps (formation of electrical contacts, isolation of one device from the other, etc.) leading to the achievement of a functional device.

The growth substrate 1 includes a growth medium 2. This can be a circular wafer of material, e.g., silicon or sapphire, of standardized dimensions, e.g., 2 inches (50 mm), 4 inches (100 mm) or even 200 mm in diameter. But the disclosure is by no means limited to these dimensions or shapes.

The nature of the growth medium 2 is generally selected so as to be able to withstand treatments (such as depositions, heat treatment, etc.) implemented when manufacturing the actual growth substrate 1 and when manufacturing the optoelectronic devices. Preferably, the growth medium 2 has a thermal expansion factor similar or close to that of the materials that will form the useful layer of the optoelectronic device so as to limit the significant strains that could damage these devices following their production.

The growth substrate 1 also comprises a plurality of crystalline semiconductor islands 3 (hereinafter simply referred to as "island(s)"), placed on the growth medium 2. Each island 3 is intended to carry the active layers of an optoelectronic device, such as a LED, a laser or a photovoltaic cell. To this end, the islands 3 can be made of III-N materials. For the formation of nitride-based LEDs, the islands 3 can thus consist of GaN or InGaN, and in which the proportion of indium may vary between 0% and 20% and, in particular, between 1.5% and 8%.

The term "island" refers to a block of material that is entirely separate from the other islands arranged on the growth medium 2. The term "crystalline" means that the atoms making up an island 3 are assembled in an orderly manner to form a block of monocrystalline material, the block may nevertheless comprise arrangement defects such as dislocation, slip plane or point defect.

The islands 3 are separated one from another by trenches 4. These trenches may have a lateral dimension, separating two islands 3, ranging from 0.1 to 50 microns, or from 1 to 50 microns, and typically in the range of from 2 to 20 microns. Each island has a relatively reduced size in relation to the growth substrate that may range from, for example, 1 micron to 1 mm in thickness, depending on the intended final application. The surface of the islands 3 may range from 1 $\mu m^2$ or 4 $\mu m^2$ to 1 $mm^2$, and preferably from 25 $\mu m^2$ to 400 $\mu m^2$. Each island 3 can have any shape, e.g., circular, square, triangular, hexagonal or rectangular, when viewed from above. Its thickness is typically less than 200 nm, in particular, when it consists of InGaN. The islands 3 can all be of identical or different shapes and dimensions.

According to the disclosure, the islands 3 do not all have the same lattice parameter. Thus, a first group of islands 3a has a first lattice parameter and a second group of islands 3b has a second lattice parameter that is different from the first.

The materials of islands 3 are not identical from one group to another. Moreover, the state of strain of the islands 3 making up the two groups 3a, 3b may also be different from one group to the next.

Accordingly, the two groups of islands 3a, 3b have different lattice parameters.

This characteristic of the growth substrate 1 will be used advantageously to collectively manufacture optoelectronic devices that have distinct light properties, using a single manufacturing technology and a single growth substrate.

As an example, on the first group of islands 3a that has the first lattice parameter, it will be possible to form a first LED that directly emits at a first wavelength, e.g., in the green range, and on the second group of islands 3b that has the second lattice parameter, a second LED directly emitting at a second wavelength, e.g., in the blue range. The terms "directly emitting" are used to indicate that the emission corresponds to the light radiations emitted by an LED's active layers (quantum wells), without needing to use phosphorus conversion.

It may also be provided that the growth substrate 1 comprises at least one additional group of islands (i.e., a third group of islands), this third group of islands having a third lattice parameter that is different from the first and the second. More generally, the growth substrate may comprise any number of island groups, each group being formed by islands having a lattice parameter that is different from that of the islands belonging to other groups. In this way, it will be possible to obtain a growth substrate 1 allowing the formation of LEDs emitting, for example, in the range of red, green, blue, and infra-red wavelengths on the same substrate using a single technology.

The distribution and arrangement of the groups of islands 3a, 3b on the surface of the growth medium 2 is not an essential characteristic of this aspect of the disclosure, and all possible distributions and arrangements may be considered. They may sometimes be dictated by the application under consideration.

A first example of distribution and arrangement of the first and second groups of islands 3a, 3b on the surface of the medium 2 has thus been represented on FIGS. 1A and 1B. In this example, the first group of islands 3a occupies a first area of the growth medium 2 and the second group of islands 3b a second area of the growth medium 2, which are separate one from the other and adjacent to each other.

Figure 2A:
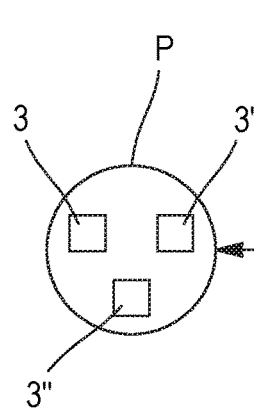
FIGS. 2A, 2B, and 2C show an example of how the crystalline semiconductor islands can be arranged and distributed on the surface of a growth medium.

Advantageously, the islands 3, 3', 3" of a first, second, and third group of islands may be placed next to each other, which would allow the respective formation of LEDs emitting in different colors, e.g., red, green, and blue, respectively. This arrangement is represented schematically in FIG. 2A. Such a combination of LEDs constitutes a bright pixel P whose emission color can be controlled. The islands 3, 3', 3" that will carry the LEDs constituting these pixels P can be arranged in a regular manner on the surface of the growth medium 2. Monolithic pixels P may thus be formed, i.e., placed on the same substrate and handleable as a pixel, e.g., by a component insertion device, in order to be included in a functional device.

Figure 2B:
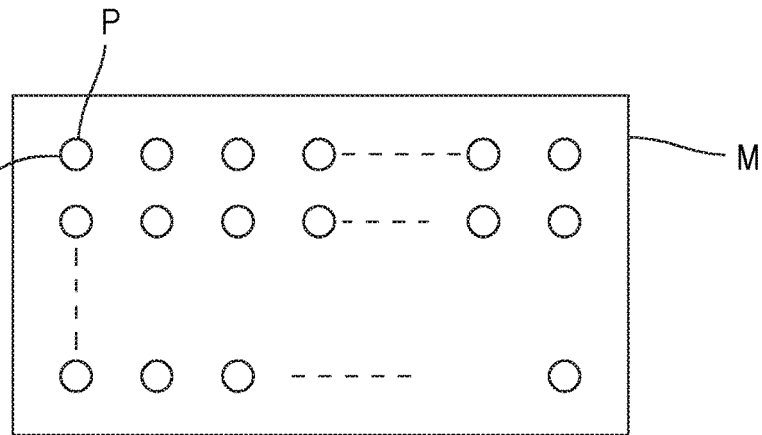
Figure 2C:
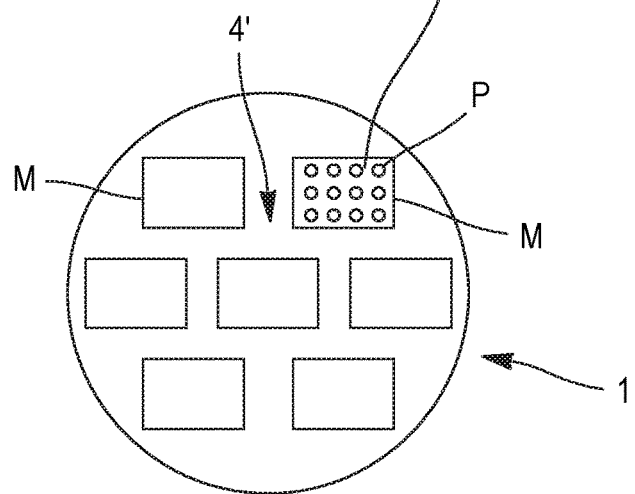

In the case where the formation of a monolithic micropanel of LEDs is intended, e.g., for a color micro-display screen, the pixels P could, for example, be distributed evenly according to lines and rows to form a matrix M, as represented in FIG. 2B. And a growth substrate 1 may comprise a plurality of such matrices M, as represented in FIG. 2C.

Returning to the description of FIGS. 1A and 1B, and in addition to the growth medium 2 and the crystalline semiconductor islands 3, the growth substrate 1 also comprises at least one assembly layer 5 arranged between the growth medium 2 and the islands 3. Herein, the assembly layer is directly in contact with the growth medium and with the islands 3, but the growth substrate could comprise other intermediary layers. This assembly layer 5 may include a layer of silicon oxide or silicon nitride, or consist of a stack of such layers designed to, for example, facilitate subsequent removal of the growth medium.

The assembly layer 5 does not have a uniform thickness. For reasons that will become apparent in connection with the description of the growth substrate's 1 manufacturing method, the assembly layer has a first thickness at the level of the islands 3 of the first group of islands 3a and a second thickness, which is different from the first, at the level of the islands 3 of the second group of islands 3b. In more general terms, the assembly layer 5 has a distinct thickness at the level of the islands of each of the substrate's 1 groups of islands.

Method for Manufacturing a Growth Substrate

With reference to FIGS. 3A to 3M, an example of a method for manufacturing a growth substrate according to the disclosure is now disclosed.

The method implements the principles of the crystalline semiconductor islands transfer and relaxation technology, such as they are described, for example, in documents EP2151852, EP2151856 or FR2936903.

As a reminder, according to an exemplary embodiment compliant with this approach, a strained crystalline semiconductor layer is first formed on a donor substrate. This layer is then transferred to a substrate comprising a flow layer such as, for example, a layer of borophosphosilicate (BPSG) glass, by bonding and by thinning and/or fracturing the donor substrate. The islands are then defined in the transferred layer, and a heat treatment is subsequently applied to the substrate and the islands at a temperature that is higher than the viscosity transition temperature of the flow layer, which leads to at least partial relaxation of the islands. The degree of relaxation achieved following the relaxation heat treatment can reach 70 to 80% or 95% of the maximum degree of relaxation corresponding to the achievement of a perfectly relaxed layer. This degree of relaxation depends on the thickness and nature of the islands as well as on the duration and extent of the heat treatment.

To assist this relaxation and prevent an island warpage phenomenon during the plastic deformation that takes place during relaxation, a stiffening layer may be formed on or under the islands prior to applying the relaxation heat treatment. As explained in detail in the document titled "Buckling suppression of SiGe islands on compliant substrates," Yin et al. (2003), *Journal of Applied Physics*, 94(10), 6875-6882, the degree of relaxation of an island achieved after this heat treatment step is that which balances the strains in the stiffening layer and in the island. It should be noted that the stiffening layer can be formed from (or include) a residue of the donor substrate that would have been preserved on the stressed layer following the transfer thereof onto the flow layer. It may have been placed on the exposed face of the donor substrate to end up under the island after the transfer of the strained layer and the formation of the islands.

The present disclosure takes advantage of the relaxation phenomenon to provide a method for manufacturing a plurality of crystalline semiconductor islands having a variety of lattice parameters.

As represented on FIGS. 3A to 3D, a method according to this disclosure includes the preparation of a donor substrate 11, comprising a plurality of strained elementary layers 12a, 12b of crystalline semiconductors forming a stack 12. The stack has at least one first area 13a and one second area 13b that have different strain levels.

Figure 3A:
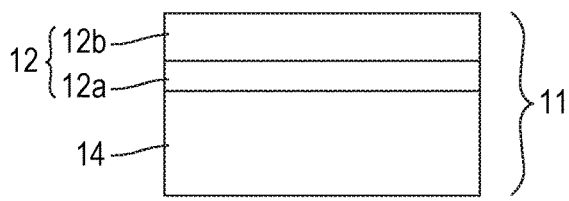
FIGS. 3A to 3M show a method for manufacturing a growth substrate according to the disclosure.

FIG. 3A shows the first step in preparing the donor substrate 11. It includes the supply of a base substrate 14, which may comprise, for example, sapphire, silicon or silicon carbide. A stack 12 of semiconductor and crystalline elementary layers is formed on the base substrate 14, each layer in the stack having a different nature. In the example shown in FIG. 3A, two crystalline semiconductor elementary layers 12a, 12b are formed. By way of illustration, the first elementary layer 12a can be a layer of gallium nitride having a thickness of 2 microns or more, forming a buffer layer and whose upper part is essentially relaxed. The second elementary layer 12b can be a layer of InGaN of a thickness of about 100 nm and whose proportion of indium is about 6%. The second elementary layer 12b in the stack 12, and in general terms each elementary layer in the stack 12, has a thickness that is less than its critical relaxation thickness. At least some of the layers are thus strained, in compression in the example chosen above. In this way, the second elementary layer 12b (or each layer in the stack 12 formed on top of the first elementary layer 12a) is pseudomorphic and, thus, has a lattice parameter that is identical to the lattice parameter of the first layer 12a in the stack 12.

Figure 3B:
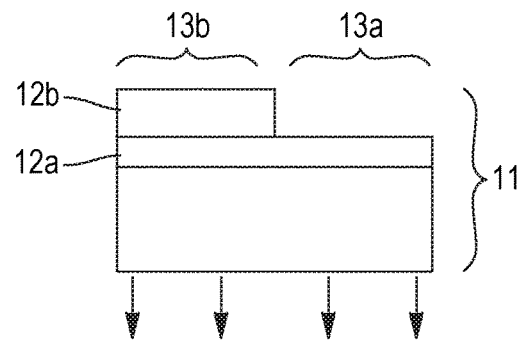

A subsequent step in the preparation method of the donor substrate 11 is shown in FIG. 3B, which comprises locally eliminating the second elementary layer 12b to expose part of the first elementary layer 12a. This elimination step may involve traditional means of photolithographic masking and etching, e.g., dry etching. In this way, a first area 13a is defined on the exposed surface of the donor substrate 11 in which the first layer 12a is exposed, and a second area 13b is defined in which the second layer 12b of the stack is exposed. Generally speaking, during this step, part of the stack 12 is locally removed so as to preserve, in respective areas 13, only part of the layers that form the stack 12. The areas 13 have strain levels that are different one from another, since each area 13 is respectively formed by a different stack of one or of a plurality of elementary layers, each in a different state of strain.

Thus, in the example shown in FIG. 3B, the first area 13a includes the first layer 12a and has a first reference strain level. The second area 13b includes the stack formed of the first layer 12a and the strained second elementary layer 12b. The second area 13b therefore has a higher strain level than the first area 13a.

The first and second areas 13a, 13b are not necessarily all in one piece, i.e., locally eliminating elementary layers of the stack 12 to expose a specific layer can be carried out in a plurality of distinct and non-contiguous locations. The term "area" will be used to designate the collection of locations on the surface of the donor substrate 11 having the same strain level, e.g., for which the same layer 12a, 12b of the stack 12 is exposed following the elimination step.

The first and second areas 13a, 13b of the donor substrate will each respectively allow creating the islands 3 of the first and second groups of relaxed islands 3a, 3b of a growth substrate 1. These areas on the surface of the donor substrate 11 will be defined in such a way that they correspond to the chosen arrangement of the islands 3 of the groups 3a, 3b, as this has been disclosed above in connection with FIGS. 2A to 2C.

Figure 3C:
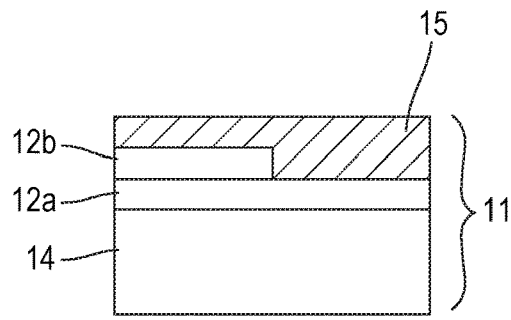
Figure 3D:
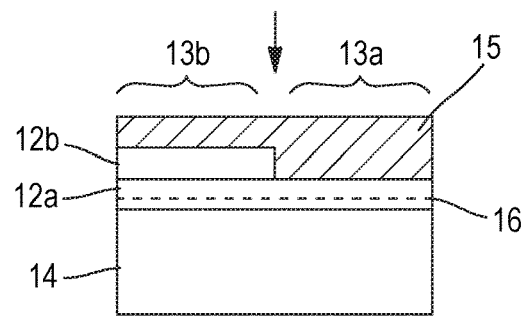

The following donor substrate 11 preparation steps shown in the FIGS. 3C and 3D are aimed at preparing the transfer of the stack 12 thus defined to a relaxation medium 7.

The formation of a bonding layer 15 having a plane and smooth exposed surface is thus provided to enable the assembly of the donor substrate 11 on the medium 7. This can be a dielectric layer, e.g., made of silicon dioxide or silicon nitride. When silicon dioxide is used, it may include boron and/or phosphorous to provide it with flow properties when the bonding layer 15 is exposed to a temperature that is higher than its glass transition temperature. This bonding layer 15 is deposited with a sufficient thickness to be able to encapsulate the entire stack 12 and thus provide a planar surface. When its formation provides for applying a polishing step, the removal of thickness that occurs during the polishing process must be taken into account. For example, a thickness of 500 nm or more of material can be deposited to form the bonding layer 15.

In an optional step shown in FIG. 3D, light atomic species, such as hydrogen or helium, are introduced in the donor substrate 11. The introduction of these species leads to formation of a brittle plane 16 that allows for the base substrate 14 to be removed in a subsequent step of the manufacturing method and to transfer the stack 12 to the relaxation medium 7. The brittle plane 16 may preferably be located in the base substrate 14 or in the first elementary layer 12a of the stack 12 so that the stack 12 may be transferred to the medium 7.

It should be noted that, in some instances, the brittle plane 16 may not be perfectly planar when the introduction of the light species is carried out by implanting ions through the bonding layer 15 and through the elementary layers of the stack 12. This has no consequence on the application of the manufacturing method, in as far as this plane remains well localized within the stack 12. It should be understood that the order of the steps for forming the bonding layer 15 and for forming the brittle plane 16 may be reversed to prevent this phenomenon. In some embodiments, the brittle plane 16 may be formed before the areas 13 having different strain levels are defined. In any case, it may be ensured that, during the formation of the bonding layer 15, the donor substrate 11 is not exposed to an excessive thermal budget, which may cause the deformation of the stack by a bubbling effect of the implanted species.

Figure 3E:
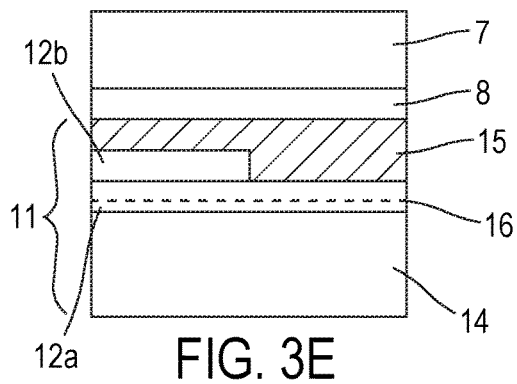
Figure 3F:
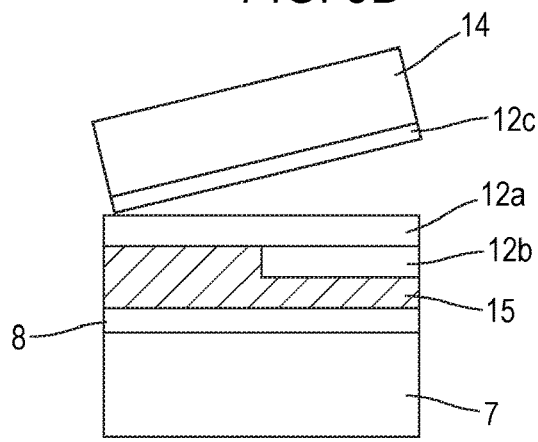

FIGS. 3E and 3F respectively show the assembly of the donor substrate 11 with the relaxation medium 7, and the removal of the base substrate 14 and of a residue 12c of the first elementary layer 12a. The removal is performed after a fracture of the assembly at the brittle plane 16, which in the illustrated embodiment is located in the first elementary layer 12a. This removal step may include the exposure of the assembly to a moderate temperature of a few hundred degrees and/or the application of strains, e.g., mechanical.

However, a manufacturing method according to the disclosure is in no way limited to a transfer involving the formation of a brittle plane 16. It is feasible to perform the transfer to the medium 7 by mechanical/chemical removal of the base substrate 14, in particular, when it comprises a silicon substrate. It is also feasible to detach it by laser irradiation of the interface separating the base substrate 14 and the first elementary layer 12a, in particular, when the base substrate comprises a sapphire substrate.

The relaxation medium 7 has been previously provided with a flow layer 8 so that, after the operation of removing the base substrate 14, a relaxation substrate 6 is obtained, which comprises the relaxation medium 7, the flow layer 8, the bonding layer 15 and the stack 12 of crystalline semiconductor elementary layers defining areas 13 having different strain levels.

Figure 3G:
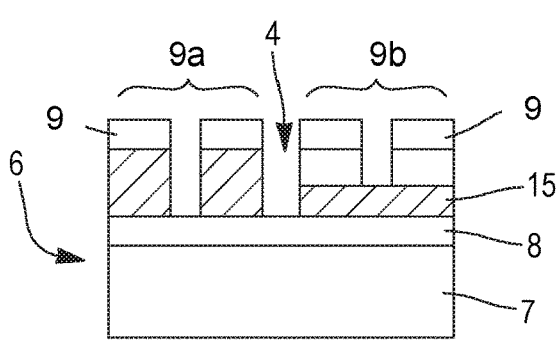

In the following step, shown in FIG. 3G, trenches 4 are made in the stack 12 so as to define strained islands 9. The trenches 4 are made in the stack 12 to define the islands 9 of a first group of islands 9a in the first area 13a and to define the islands 9 of a second group of islands 9b in the second area 13b. These trenches 4 may enter into the bonding layer 15, and even into the flow layer 8. This step of defining the islands 9 can be carried out after the transfer of at least part of the stack 12 as shown here, but it is also feasible to carry out this step before the transfer of the stack 12, directly onto the donor substrate 11. As mentioned above, the formation of trenches 4 may lead to the definition of islands 9 of very varied shapes and dimensions.

In any event, following these steps a relaxation substrate 6 is obtained, which comprises a medium 7, a flow layer 8 arranged on the medium and a bonding layer 15 arranged on the flow layer 8. As mentioned above, the flow layer 8 and the bonding layer 15 may both comprises BPSG and thus have flowing properties. The relaxation substrate 6 also includes, on the flow layer 8, a plurality of crystalline semiconductor islands all having the same initial lattice parameter. A first group of islands 9a has a first strain level. These are the islands 9 that have been formed in the stack 12 at the level of the first area 13a of this stack. A second group of islands 9b has a second strain level that is different from the first. These islands 9 of the second group 9b are the ones that have been formed in the stack 12 at the level of the second area 13b of this stack.

In more general terms, the relaxation substrate 6 may comprise a plurality of groups of islands that have different strain levels from one to the next, each group of islands having been formed in the stack 12 at the level of a well-defined area 13 of this stack 12. The strained islands 9 of each group of islands have a different lateral expansion potential from one group to the next. The strain energy contained in an island 9 of the first group 9a is thus different from the strain energy contained in an island 9 of the second group 9b. "Lateral expansion potential" refers to the lateral expansion or contraction to which an island 9 must be subject to, to reduce its elastic strain energy and balance it with the elastic strain of the flow layer with which it is in contact.

To release this strain energy and cause the differentiated lateral expansion of the islands 9 of the first group 9a and of the islands 9 of the second group 9b, the disclosure provides for the thermal treatment of the relaxation substrate 6.

This may be, for example, a heat treatment bringing the relaxation substrate 6 to a temperature of 800° C. for a period of four hours. In more general terms, the relaxation temperature chosen for this heat treatment will be such that it exceeds the glass transition temperature of the flow layer 8 and possibly that of the bonding layer 15 when it has flowing properties. This relaxation temperature typically ranges from 400° C. to 900° C. The heat treatment may last between 30 minutes and several hours.

A plurality of such heat treatments can be provided to promote the relaxation of islands 9 and their lateral expansion. It is also possible to reduce the thickness of the islands or part of them between two relaxation heat treatments for the same reasons.

Of course, if a group of islands 9 is not in a strained state, as is the case of the islands 9 consisting of the first elementary layer 12a made of gallium nitride in the previous example, the lattice parameter of these islands is not affected by the relaxation heat treatment.

In any event, since the islands forming the various groups of islands 9a, 9b initially have different strain levels, the application of the relaxation heat treatment leads to the relaxation and to a lateral expansion of the islands that is differentiated from one group to the next. The relaxed islands 3 of the first group 3a and the islands 3 of the second group 3b then have different lattice parameters.

Figure 3H:
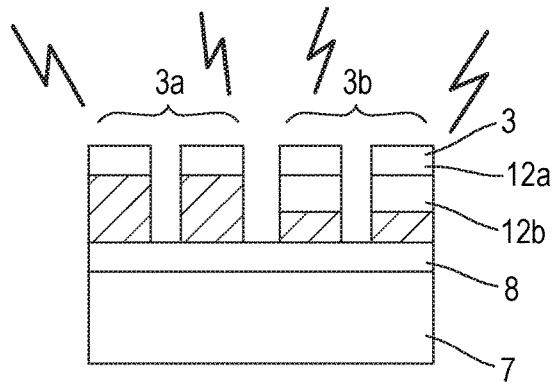
Figure 3I:
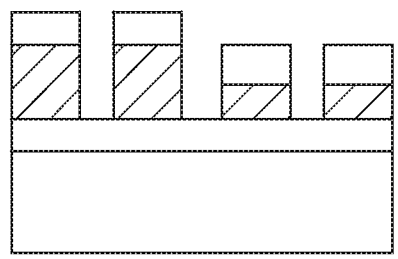
Figure 3J:
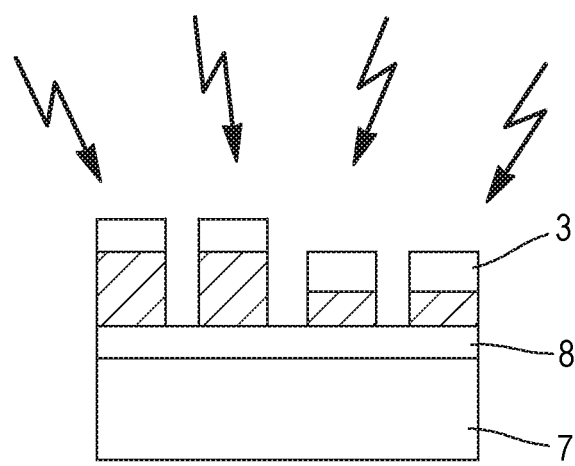

Two relaxation heat treatments leading to the relaxation of the strained islands 9 in different manners are thus shown in FIGS. 3H and 3J for the sake of illustration. As shown in FIG. 3I, a step in which the thickness of the partially relaxed islands 3 of the second group of islands 3b is reduced has been carried out between these two steps. In the example shown, reducing the thickness has led to eliminating from these islands 3 the part of the thickness corresponding to the original first elementary layer 12a so as to expose the original second elementary layer 12b. But this choice is in no way restrictive and part of the original first elementary layer 12a of the islands of the second group 3b could have been preserved or all of the islands 3 of each group of islands 3a, 3b could have been thinned.

Figure 3K:
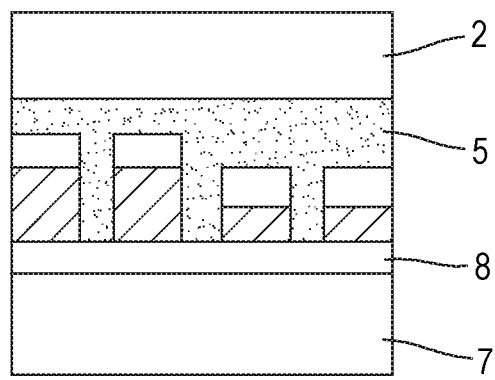
Figure 3L:
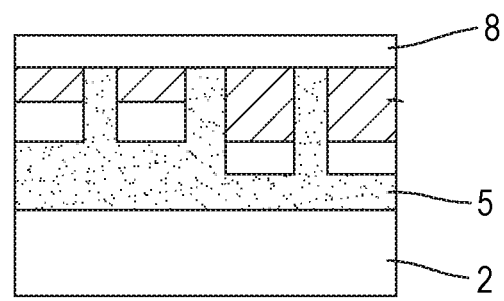
Figure 3M:
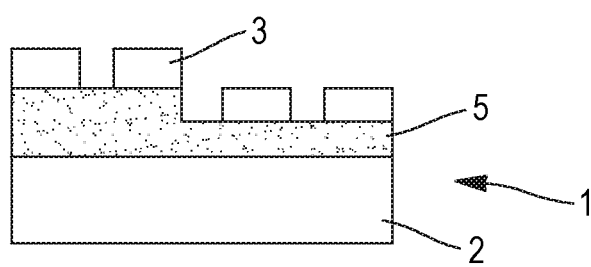

Following the manufacturing method described above, one can choose to proceed with the transfer of the at least partly relaxed islands 3 to another medium. This transfer may include carrying these islands 3 over to an intermediary medium prior to transferring them to this other medium. With reference to FIGS. 3K to 3M, the islands 3 may, for example, be transferred to a growth medium 2 by means of an assembly layer 5. To this end, the islands 3 are coated with the assembly layer 5, this layer is assembled to the growth medium 2 (FIG. 3K), the assembly layer may have undergone treatments to facilitate this, and the relaxation medium 7 is eliminated by any appropriate means to obtain the structure in FIG. 3L. The flow layer 8 and the bonding layer 15 are then eliminated from the structure obtained. Additional etching steps may help to eliminate any excess of the assembly layer 5 so as to then obtain a growth substrate 1 (FIG. 3M) such as previously described in connection with FIGS. 1A and 1B.

A growth substrate 1 that does not contain any flow layer 8 is thus obtained, since the flow layer may be incompatible with the steps required to manufacture the active layers of the optoelectronic devices. Moreover, in the case where these islands 3 are composed of a polar material, this transfer allows retrieving the initial polarity of this material, such as it had been formed on the donor substrate 11, from the exposed face of the growth medium 2.

Method for manufacturing a plurality of optoelectronic devices

The method presented above can be used to collectively manufacture a plurality of optoelectronic devices. These devices each comprise active layers that may be different from one device to another. The devices then have optoelectronic properties that differ from each other. The terms "collective manufacturing" are used to mean that the manufacture of these devices uses a single technology applied to a single substrate to form the active layers.

This method includes supplying a growth substrate 1 according to the general description provided above. Therefore, it comprises at least a first group of crystalline semiconductor islands 3a having a first lattice parameter and a second group of crystalline semiconductor islands 3b having a second lattice parameter that is different from the first.

The following step is aimed at forming the active layers by growth on the exposed face of these islands 3. As is well-known per se, to achieve this, the growth substrate is placed in a deposition chamber, e.g., that of an epitaxy frame. During deposition, streams of precursor gases flow through such a chamber, these gases comprising the atomic elements that compose the active layers to be deposited on the islands 3. The precursor gases are heated to temperature above the growth substrate 1 so as to free the atomic elements and to enable their adsorption on the surface of the growth substrate 1 and, in particular, on the surface of the islands 3. According to the nature, the relative concentration, and the period during which these precursor gases circulate, the nature and the thickness of these layers, which are progressively formed on the crystalline semiconductor islands 3, can be controlled. If this is necessary, type p or n doping agents may be introduced in the chamber to make up the doped layers. In particular, the precursor gases can be controlled to form active layers of electronic devices, such as quantum wells or LED heterostructures, on the islands.

By way of example, an active layer of LEDs may include, on an island 3 composed of InGaN having an In concentration less than 20% and at least partially relaxed (typically in the order of 90%), the stack with the following layers:
  an n-doped InGaN layer having an In concentration similar to that of the island 3;
  a multiple quantum well comprising a plurality of layers, each layer including a distinct proportion of indium, having a difference of a few percentage points in relation to that of the underlying n-doped layer. The quantum well is capable of emitting a light radiation of a wavelength selected according to the nature of the layers that it consists of;
  a p-doped InGaN layer having an In concentration ranging from 0 to 10%. To simplify its manufacturing, it can also be provided that the p-doped layer be formed from GaN.

The precursor gases used to form these active layers of LEDs can include trimethylgallium (TMGa), triethylgallium (TEGa), trimethylindium (TMIn), and ammonia ($NH_3$).

The incorporation of certain atomic elements of the precursor gases in the deposited layer is affected by the lattice parameter of this layer. This is particularly the case for what concerns the incorporation of indium in an InGaN layer, as has been reported in the document entitled "Strain effects on indium incorporation and optical transitions in green-light InGaN heterostructures of different orientations," by M. V Durnev et al., Phys. Status Solidi A 208, No.

11, 2671-2675 (2011). It appears that the solubility of indium in a material increases as the lattice parameter of this material increases. In other terms, all other things being equal, the incorporation of indium in a material during its formation by deposition increases with the lattice parameter of the material into which it is incorporated.

The present disclosure takes advantage of this observation to form the growth substrate 1 of the active layers of a plurality of optoelectronic devices, these active layers may be different from one device to another. The method generally implements a step in which the growth substrate 1 is exposed to an atmosphere comprising at least one initial concentration of an atomic element.

On the islands 3 of the first group 3*a* of the growth substrate 1, which has a first lattice parameter, the atomic element is incorporated in the active layer in a first concentration. On the islands 3 of the second group of islands 3*b*, which has a second lattice parameter that is different from the first, the atomic element is incorporated in the active layer according to a second concentration that is different from the first. If the second lattice parameter is greater than the first, the second concentration will be greater than the first.

In other terms, the first and second concentrations are determined by the initial concentration of the atomic species in the chamber and by the first and the second lattice parameters of the islands. As is well known in the field of material growth, other parameters may also influence the nature of the layers that are formed, such as, for example, the pressure of the chamber, the temperature, the respective flow of the precursor gases, etc.

By providing a growth substrate for which the first and the second lattice parameter have been adequately selected, it is possible to form active layers having different optoelectronic properties. By way of example, the proportion of indium incorporated in the InGaN active layers deposited on the islands of the first group of islands may lead to the formation of LEDs directly emitting a radiation within the blue range. At the same time, the proportion of indium incorporated in the InGaN active layers deposited on the islands of the second group of islands can lead to the formation of LEDs directly emitting a radiation within the green range.

Once the active layers have been formed on the islands, one can proceed with the method of manufacturing electronic devices, in particular, to form the electrical contacts and to isolate the devices one from another, as is described in U.S. Pat. No. 9,478,707, for example. It may also be provided that the islands 3 coated with their active layers are carried over to a LED support and that the growth medium 2 is eliminated.

Application to the Manufacturing of a Monolithic Micro-Panel of LEDs and to a Micro-Display Screen A specific application of the growth substrate and of the collective manufacturing method described above aims to manufacture a monolithic micro-panel of LEDs.

As a reminder, such a micro-panel includes an arrangement of LEDs, generally all identical and of very small size, arranged into rows and columns at a constant pitch on a panel support. When the LEDs have been manufactured collectively, the micro-panel is said to be "monolithic." This characteristic is advantageous, since the LEDs then have very similar properties (such as the current and/or voltage behavior, changes with ageing, etc.), which facilitates the design and the manufacturing of the micro-panel. Within the scope of the present disclosure, a micro-panel in which all the LEDs have been manufactured collectively and extracted collectively from the same manufacturing medium to form the micro-panel will be designated as a monolithic micro-panel; or as a micro-panel consisting of monolithic pixels, i.e., each pixel consists of LEDs manufactured collectively and extracted collectively from the same manufacturing medium. In this case, the monolithic pixels are assembled together so as to form the micro-panel.

The monolithic micro-panel of LEDs can be assembled with a pilot circuit using a "flip-chip" technology, which allows performing the electrical connection of each LED of the micro-panel with a driving circuit of the pilot circuit. This assembly may consist in assembling an entire monolithic micro-panel with a pilot circuit, each LED of the micro-panel being associated with a driving circuit after assembly. Or the assembly may consist in successively assembling one or a plurality of monolithic pixels to the pilot circuit to associate them with the pilot circuit. Regardless of the chosen approach, a monolithic micro-display screen is formed in this way.

Since the LEDs all have identical or similar electrical properties, the driving circuits of the pilot circuit may also have identical or similar electrical properties, which considerably facilitates the manufacturing of the micro-display screen.

A detailed discussion of this device and its manufacturing method can be found in "Monolithic LED Microdisplay on Active Matrix Substrate Using Flip-Chip Technology," Liu et al., *IEEE Journal of Selected Topics in Quantum Electronics* (Volume: 15, Issue: 4, July-August 2009).

Note that known monolithic micro-panels all consist of LEDs directly emitting a single wavelength thus enabling monochrome display. Color display is achieved via the phosphorus conversion placed on the emitting face of some of these LEDs, or by optically combining a plurality of micro-panels each emitting a radiation chosen in a combination of complementary colors, e.g., red, green and blue. These techniques are not advantageous for obvious reasons of complexity of implementation, of efficiency, and of density, as has been recalled in the introduction to the present application.

The methods and substrates according to the present disclosure on the contrary can be used to provide a monolithic micro-panel of LEDs comprising a panel support and a plurality of LEDs arranged on this panel. The plurality of LEDs includes a first group of LEDs capable of directly emitting a light radiation having a first wavelength and a second group of LEDs capable of directly emitting a second light radiation having a second wavelength that is different from the first.

A micro-panel according to the disclosure is thus capable of emitting different colors without needing to optically combine a plurality of micro-panels or to apply conversion means. For applications in the field of color displays, the micro-panel comprises at least three groups of LEDs, each group emitting a wavelength that is different from that of the others. For example, there can, be a first group of LEDs directly emitting in red, a second group of LEDs directly emitting in green, and a third group of LEDs directly emitting in blue wavelengths. Having a fourth group of LEDs directly emitting in the infra-red range can also be considered, this illumination being used to provide additional features to the device in which the micro-panel is integrated (tactile function, eye iris recognition, motion sensing, etc.).

For applications in the field of color displays, the LEDs of each group are arranged evenly on the panel support, e.g., spaced at a constant pitch along rows and columns in order to form a display matrix. They are also arranged to place side by side, or more precisely in close proximity to each other, a LED of each group so as to form a bright pixel, whose color can be controlled, in each location of the matrix. The size of the LEDs may vary according to the group in order to play on the distribution of the luminous intensities of the various colors of emission. For example, red LEDs may be larger than blue and green LEDs.

The micro-panel may consist of LEDs that can be used to form a matrix of large-sized pixels, e.g., of 50 pixels by 50 pixels, or of 200 pixels by 200 pixels, if not more.

Even though the bright pixels of the panel consist of LEDs emitting in different wavelengths, these LEDs have been formed collectively using a single technology and a single substrate. They thus have properties, and more specifically electrical and ageing properties, that are very similar with each other, which allows associating them with a pilot circuit consisting of driving circuits that are all identical or very similar.

An example of how to prepare a micro-panel and/or micro-display screen implementing the method for manufacturing islands having a variety of lattice parameters will now be disclosed.

A donor substrate 11 composed of a sapphire substrate 150 nm in diameter and of a stack of elementary layers having the following characteristics is prepared:
  a first layer of buffer gallium nitride 2 microns thick and whose upper part is essentially relaxed;
  a second strained InGaN elementary layer containing 8% of indium and 200 nm thick;
  a third strained InGaN elementary layer having an indium content of 16% and 40 nm thick.

An intermediate layer of AlGaN, containing between 0% and 10% of aluminum and of a thickness ranging from 1 to 3 nm, may be provided between the second and third layers. This intermediate layer allows to ensure that the stack 12, particularly the third elementary layer, is actually pseudomorphic, i.e., that all elementary layers all have the same lattice parameter. The concentration of indium increases from one layer to the next. The strain level of each layer is also increasing.

The first, the second, and the third elementary layers are exposed at the level of three areas of the donor substrate through localized etching, which can be performed in a conventional manner by photolithographic masking and dry etching. Each area is respectively distributed to the surface of the donor substrate 11 according to the pixel and matrix distribution introduced in connection with FIGS. 2A to 2C.

After defining the areas, a 500 nm thick bonding layer 15 containing silicon dioxide and boron as well as 4 weight % of phosphorous is prepared. The bonding layer is polished to enable its assembly to a sapphire growth medium 7. The stack 12 of elementary layers is then transferred to a sapphire relaxation medium 7 that is also 150 nm in diameter, e.g., according to the fracture implantation technique explained in detail in the general description of the method. The sapphire substrate 7 has been previously provided with a BPSG flow layer 8, i.e., containing silicon dioxide as well as boron and phosphorous, in this case with 4 weight % phosphorous and 6 weight % boron.

After the stack 12 has been transferred to the flow layer 8 of the sapphire relaxation substrate 7, three groups of strained islands 9 are delimited by making trenches 4, the islands 9a of the first group of islands are defined in the first area 13a, the islands 9b of the second group are defined in the second area and islands of the third group are defined in a third area of the stack. In this case, the islands 9a, 9b are all 10 microns squares. The islands 9 of the first group consist of a single layer of GaN, the first elementary layer that is essentially relaxed. The islands 9 of the second group consist of a stack composed of one layer of GaN and one layer of InGaN containing 8% of indium, the second elementary layer is strained. The islands of the third group consist of a stack composed of one layer of GaN, one layer of InGaN containing 8% of indium (the second elementary layer) and a layer of InGaN containing 16% of indium (the third elementary layer).

A first relaxation heat treatment aimed at making the flow layer 8 and the bonding layer 15 cold flow and at releasing the islands' strains is then carried out. In this example, the step is carried out at 800° C. for 4 hours.

Since the islands 9 of the first group of islands are not strained, their lattice parameter does not change in the course of this heat treatment. The islands of the second and third groups consist of a stack of layers that have different strain levels. The lattice parameter of these islands tends towards the equilibrium lattice parameter of the layer stack that they consist of. The parameter obtained will be close to the lattice parameter of the alloy (In,Ga)N of average composition over the thickness of the stack.

In a subsequent step, the islands are partially etched in order to thin them. The etched thickness is typically in the order of 100 nm. The thickness of the islands is then about 50 to 60 nm. The flowing of the flow layer 8 and of the bonding layer 15 is again caused by the application of a new relaxation heat treatment to release the remaining strains of the islands of the second and third groups. In this case, the conditions of the second heat treatment are identical to those of the first.

The relaxation heat treatment can be renewed, possibly in combination with a thinning of the islands to make their lattice parameters converge toward their target lattice parameter.

In any event, repeating these steps leads to the differentiated relaxation of the island groups and, following these steps, the first group of islands 3a has a lattice parameter typically ranging from 3.180 A to 3.190 A, the second group has a lattice parameter ranging from 3.210 A to 3.225 A and the third group has a lattice parameter ranging from 3.240 A to 3.255 A.

The relaxed or partially relaxed islands 3 are then carried over by bonding on a growth medium 2 provided with an assembly layer 5, e.g., a multilayer of silicon dioxide and nitride. A growth substrate 1 is thus formed.

It is then placed in a chamber of an epitaxy frame, in which a set of precursor gases (TMGa, TEGa, TMIn, and $NH_3$) is circulated in order to make active layers of nitride-based LEDs grow on each of the islands.

The lattice parameters of the islands of the first group, of the second group, and of the third group of islands being different from each other, the incorporation of indium in the active layers of InGaN that form on the islands of these groups also is different. On the islands of the first group, LEDs directly emitting radiation in the blue range are obtained, on the islands of the second group LEDs directly emitting radiation in the green range, and on the islands of the third group LEDs directly emitting radiation in the red range are formed.

Following this deposition step, on the growth substrate 1, there thus are active layers of LEDs arranged at the level of a pixel and emitting colors in the red, green, and blue ranges.

The manufacturing of a functional LED on the growth substrate can be completed, among others, by forming the LED contacts on either side of the active layers.

If at this stage, monolithic micro-panels are desired, the wafer on which rest the LEDs that have just been formed can be cut along the trenches 4' defining the pixel matrices. Each of these matrices then constitutes a micro-panel.

Alternatively, the wafer comprising the micro-panels may also be assembled with a second wafer on which pilot circuits, consisting of a matrix of driving circuits, have been formed. Each matrix is arranged on the surface of this wafer according to the same arrangement as the LEDs on the growth substrate. The assembly enables contacting electrically each diode with a driving circuit. A plurality of display screens is constituted in a single contacting step. It can then be decided that the growth medium 2 be eliminated, e.g., by laser irradiation, as well as the assembly layer 5, e.g., by chemical etching, so as to expose a light emission surface of the LEDs. These surfaces can be prepared using optical surface treatment or protection elements in order to improve the quality and the robustness of the screen. The wafer can be cut out in a conventional manner so as to isolate the screens from each other in view of packaging them.

Of course, the disclosure is not limited to the described embodiments and alternative solutions can be used without departing from the scope of the disclosure as defined in the claims.

For example, the differentiated properties of the islands can be used to create devices other than the LEDs or displays that have been used as examples. These may include lasers or photovoltaic devices.

What is claimed is:

1. A method for manufacturing a plurality of crystalline semiconductor islands having a variety of lattice parameters, the method comprising the following steps:
    providing a relaxation substrate comprising a medium, a flow layer disposed on the medium and, arranged on the flow layer, a plurality of crystalline semiconductor islands having the same initial lattice parameter located on the flow layer, the plurality of crystalline semiconductor islands comprising a first group of islands having a first lateral expansion potential and a second group of islands having a second lateral expansion potential that is different from the first lateral expansion potential; and
    heat-treating the relaxation substrate to a relaxation temperature that is higher than or equal to the a glass transition temperature of the flow layer to cause differentiated relaxation of the islands of the first and second groups, the lattice parameter of the first group of relaxed islands and that of the second group of relaxed islands then having different values.

2. The method of claim 1, wherein the step of providing the relaxation substrate comprises:
    forming a stack of elementary crystalline semiconductor layers on a base substrate, the stack of elementary crystalline semiconductor layers having a first area and a second area that have different strain levels;
    transferring at least part of the stack of elementary crystalline semiconductor layers to the medium; and
    forming trenches in the stack of elementary crystalline semiconductor layers to form the islands of the first group of islands in the first area and to form the islands of the second group of islands in the second area.

3. The method of claim 2, wherein the formation of the trenches in the stack of elementary crystalline semiconductor layers is performed after transferring at least part of the stack of elementary crystalline semiconductor layers to the medium.

4. The method of claim 3, wherein forming the stack of elementary crystalline semiconductor layers on a base substrate comprises:
    forming a plurality of pseudomorphic elementary layers having different compositions; and
    locally removing part of the elementary layers to define the first area and the second area.

5. The method of claim 4, further comprising forming a planarization layer on the stack to allow assembly of the stack to the base substrate.

6. The method of claim 5, wherein the relaxation temperature is between 400° C. and 900° C.

7. The method of claim 6, wherein the crystalline semiconductor islands comprise a III-N material.

8. The method of claim 7, further comprising a transfer step including transferring relaxed islands of the first group and relaxed islands of the second group to a growth medium.

9. The method of claim 8, wherein the transfer step includes temporarily transferring the relaxed islands of the first group and the relaxed islands of the second group to an intermediary medium prior to transferring the relaxed islands of the first group and the relaxed islands of the second group to the growth medium.

10. The method of claim 2, wherein forming the stack of elementary crystalline semiconductor layers on a base substrate comprises:
    forming a plurality of pseudomorphic elementary layers having different compositions; and
    locally removing part of the elementary layers to define the first area and the second area.

11. The method of claim 2, further comprising forming a planarization layer on the stack to allow its assembly to the base substrate.

12. The method of claim 1, wherein the relaxation temperature is between 400° C. and 900° C.

13. The method of claim 1, wherein the crystalline semiconductor islands comprise a III-N material.

14. The method of claim 1, further comprising a transfer step including transferring relaxed islands of the first group and relaxed islands of the second group to a growth medium.

15. The method of claim 14, wherein the transfer step includes temporarily transferring the relaxed islands of the first group and the relaxed islands of the second group to an intermediary medium prior to transferring the relaxed islands of the first group and the relaxed islands of the second group to the growth medium.

\* \* \* \* \*